(12) United States Patent
Gearhardt et al.

(10) Patent No.: US 7,202,656 B1
(45) Date of Patent: Apr. 10, 2007

(54) METHODS AND STRUCTURE FOR IMPROVED HIGH-SPEED TDF TESTING USING ON-CHIP PLL

(75) Inventors: Kevin Gearhardt, Fort Collins, CO (US); Douglas Feist, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 177 days.

(21) Appl. No.: 11/061,292

(22) Filed: Feb. 18, 2005

(51) Int. Cl.
*G01R 23/12* (2006.01)
*G01R 23/175* (2006.01)
*G01R 13/02* (2006.01)

(52) U.S. Cl. .............. 324/76.53; 324/76.54; 324/76.82

(58) Field of Classification Search .......... 324/76.53, 324/76.54, 76.82
See application file for complete search history.

(56) References Cited

U.S. PATENT DOCUMENTS

| | | | |
|---|---|---|---|
| 5,384,541 A * | 1/1995 | Chu et al. | 324/617 |
| 5,614,838 A * | 3/1997 | Jaber et al. | 324/765 |
| 6,671,847 B1 * | 12/2003 | Chao et al. | 714/744 |
| 2003/0020451 A1 * | 1/2003 | Ozaki | 324/76.54 |
| 2003/0101396 A1 * | 5/2003 | Price | 714/726 |
| 2004/0239310 A1 * | 12/2004 | Oshima et al. | 324/158.1 |

OTHER PUBLICATIONS

R. Press et al.; Heading Off Test Problems Posed By SOC; EETimes; Oct. 16, 2000; www.eetimes.com.

* cited by examiner

*Primary Examiner*—Vincent Q. Nguyen
*Assistant Examiner*—Amy He
(74) *Attorney, Agent, or Firm*—Duft Bernsen & Fishman, LLP

(57) ABSTRACT

Methods and structure for improved high-speed TDF testing using an on-chip PLL and associated logic to generate high speed launch and capture pulses. A reference clock may be applied to a PLL circuit within the integrated circuit under test to generate a higher frequency PLL Clock. Gating Logic features and aspects within the integrated circuit may apply the PLL Clock signal to a TDF Clock signal when so directed by a TDF Enable signal from an external test system. The PLL Clock is applied to the TDF Clock signal path for precisely two clock pulses for use as a launch and capture pulse sequence for TDF testing at higher speeds than the external automated test system may achieve.

4 Claims, 4 Drawing Sheets

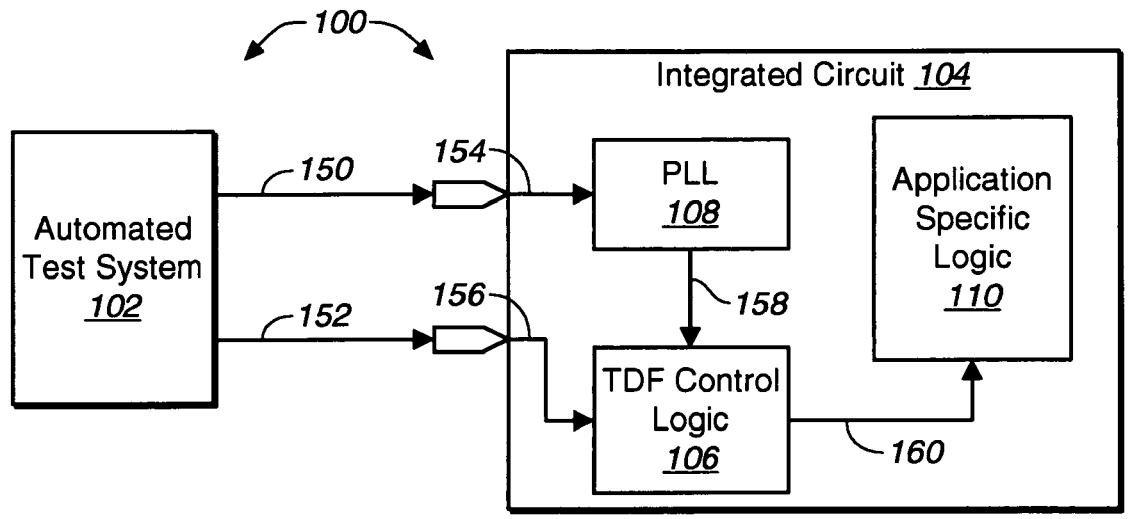
FIG._1
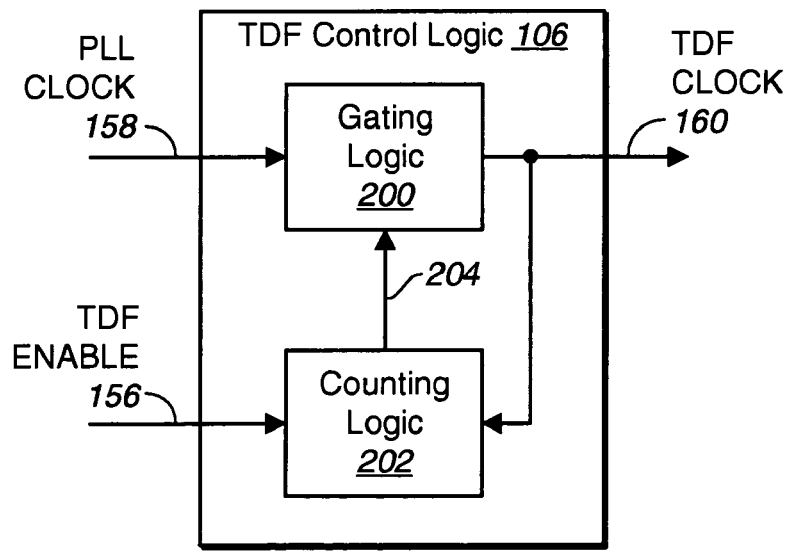
FIG._2

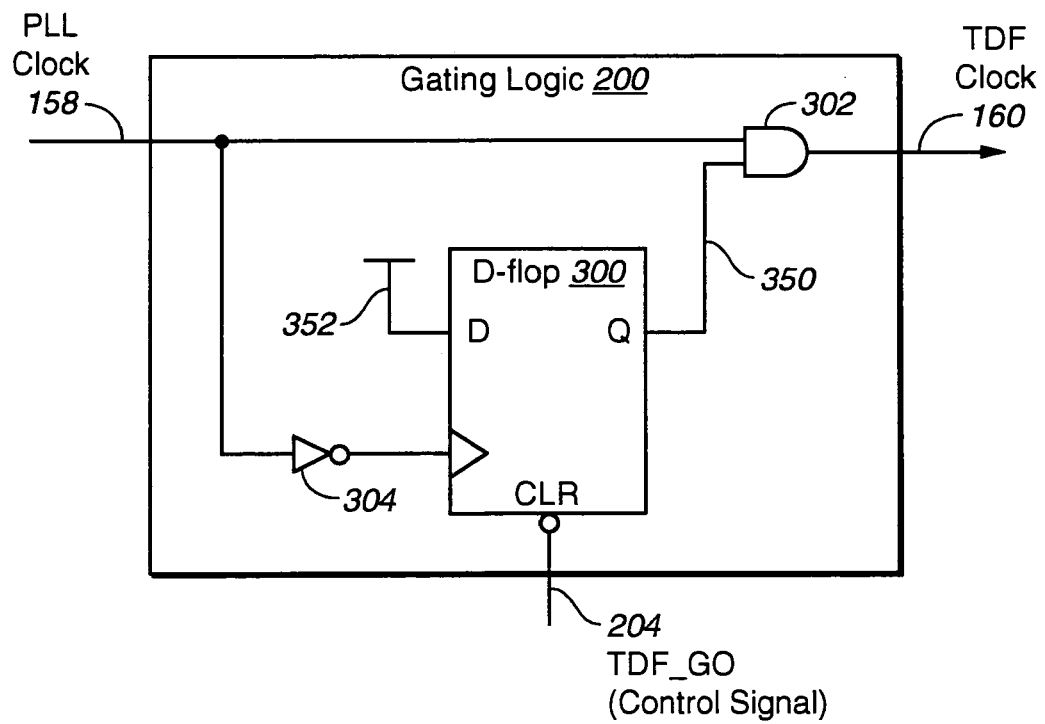
FIG._3
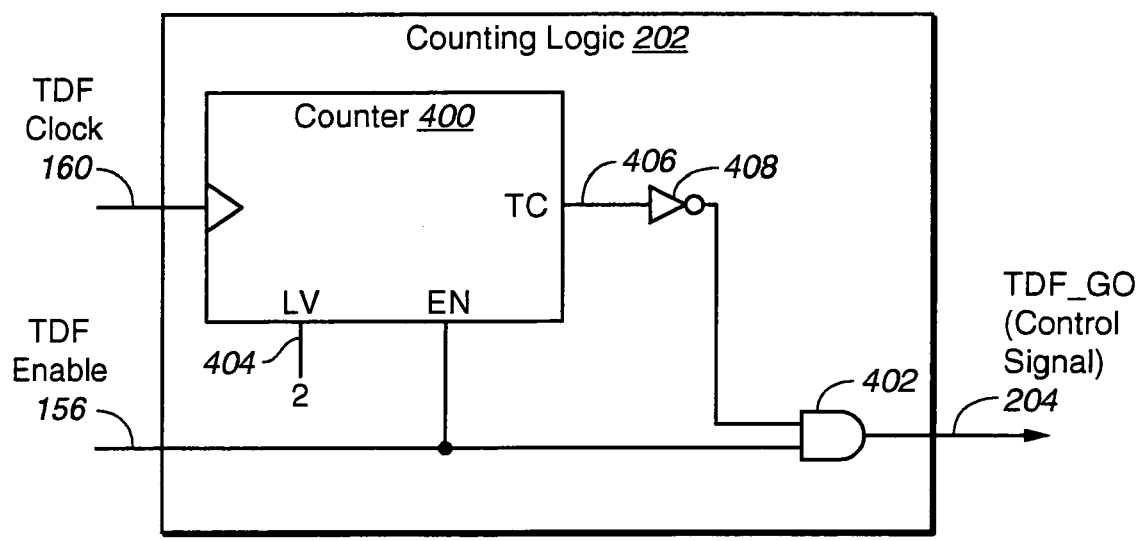
FIG._4

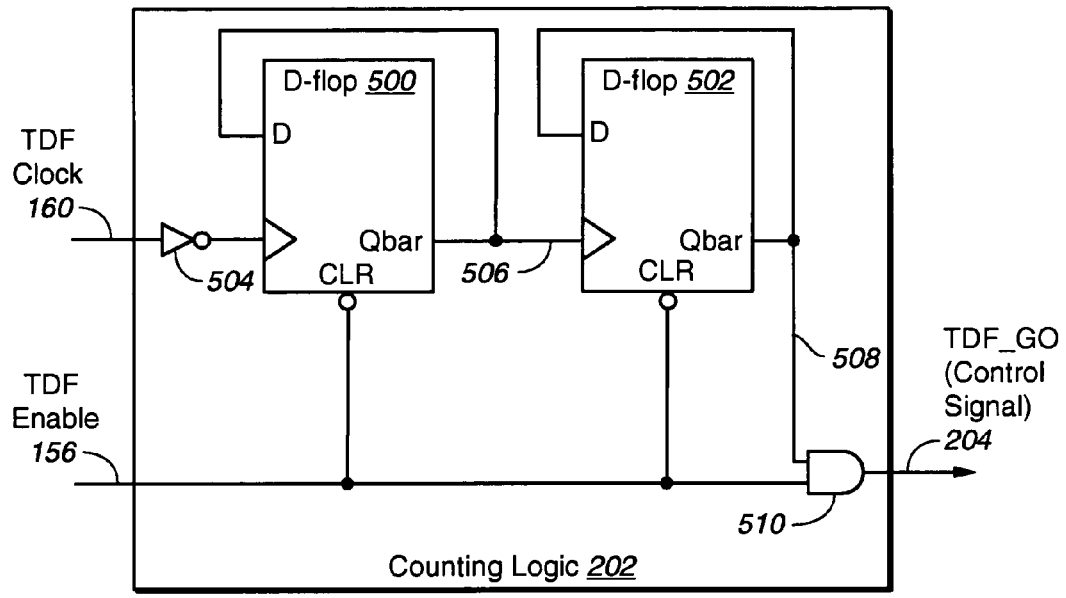
FIG._5
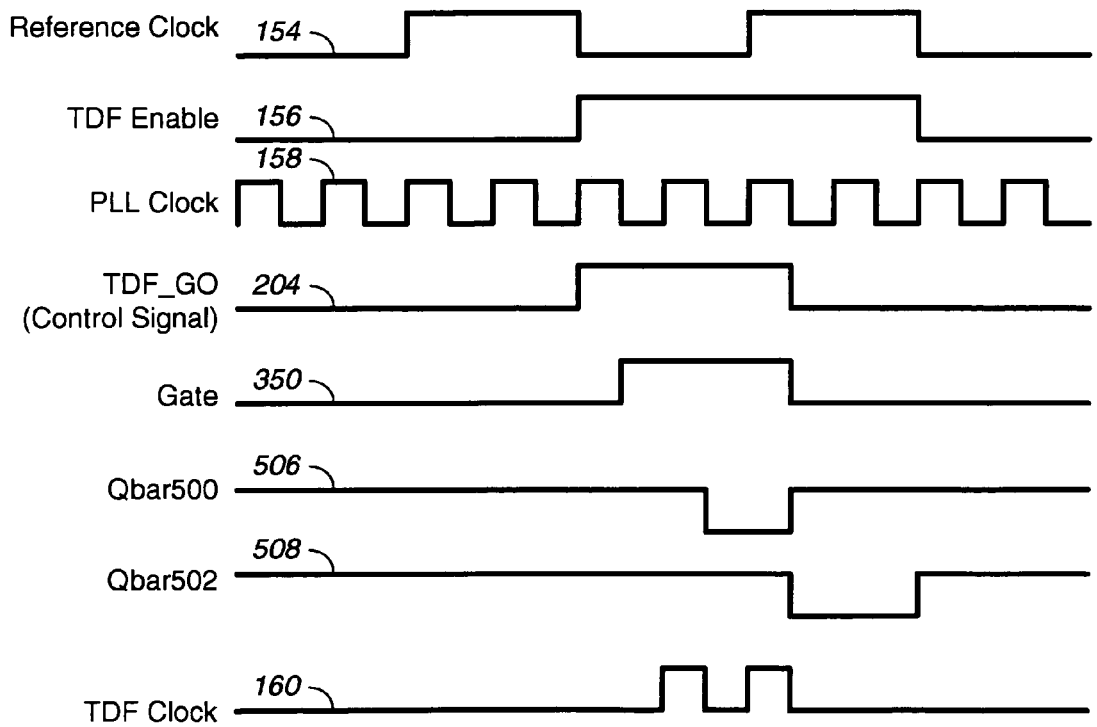
FIG._6

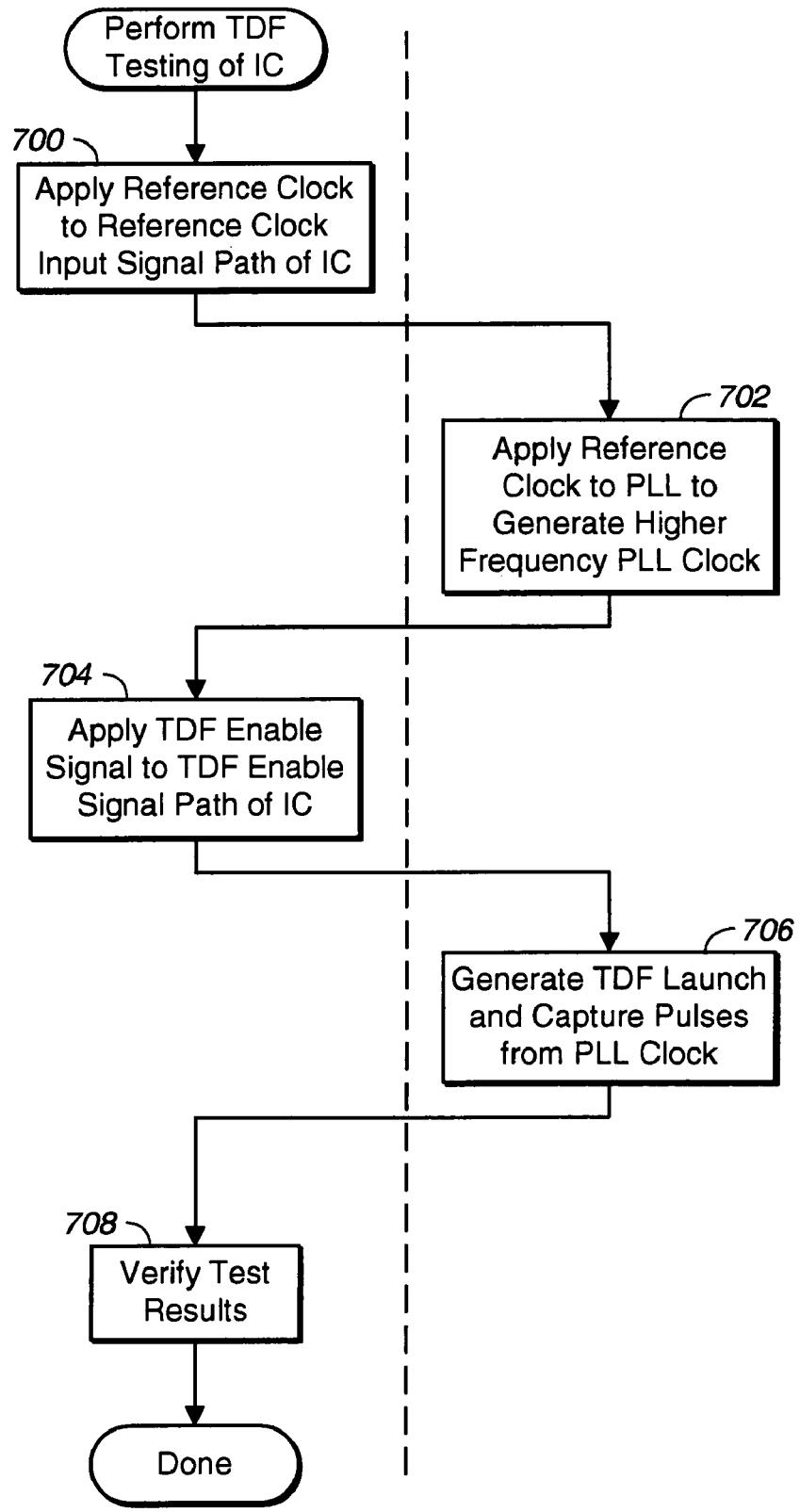
FIG._7

METHODS AND STRUCTURE FOR IMPROVED HIGH-SPEED TDF TESTING USING ON-CHIP PLL

BACKGROUND OF THE INVENTION

1. Field of the Invention

The invention relates to testing of electronic circuits and in particular relates to improved methods and structures for timing delay fault ("TDF") testing at high-speed using an on-chip phase lock loop ("PLL").

2. Discussion of Related Art

Designers and manufacturers of integrated circuits test the fabricated circuits to verify proper design and fabrication. In earlier days of integrated circuit fabrication and design, so called "stuck at" signal testing often sufficed where tests could be performed by an external, automated test system to determine if a particular pin or signal, externally accessible from the integrated circuit, was stuck at a particular logic level rather than responding normally to the desired behavior of the integrated circuit. Such simple stuck at testing generally proceeded by applying an external stimulus to one or more input signal pins of the integrated circuit and verifying proper, expected output signals generated by the integrated circuit under test. The automated test system would generate and apply such external stimuli and would sense the proper response on associated output signal paths of the integrated circuit under test.

As design and fabrication techniques grew more complex and demands for quality increased, more sophisticated testing techniques have evolved. One such testing technique is often referred to as timing delay fault testing or "TDF" testing. In general, timing delay fault testing generates a rapid succession of clock pulses to verify a proper operation of aspects of an integrated circuit under test in response to the sequence of rapid test pulses. A first test pulse in TDF testing is referred to as the "launch clock" or "launch pulse". A second successive generated clock pulse generated is referred to as the "capture clock" or "capture pulse". In general, the TDF testing launch pulse initiates operation of a particular sequence of intended logic within the integrated circuit under test and the capture pulse verifies the state of the integrated circuit at a prescribed time delay after the launch pulse. Integrated circuit designs have rapidly increased in speed such that they utilize high frequency clock rates. TDF testing techniques and signals are generally operable at similar frequencies to the frequency at which the integrated circuit operates.

Automated test systems are highly complex and costly systems. Since integrated circuit clock rates have advanced rapidly, a problem has arisen in performing TDF testing using older, legacy automated test systems. The older, legacy automated test systems may be incapable of generating launch and capture clock pulses for TDF testing at a high enough frequency to adequately test present day integrated circuit designs and fabrication techniques. One solution, of course, is to discard and/or upgrade the older, legacy automated test system with more modern, higher speed test systems to permit TDF testing at higher clock frequencies. Such a solution may be impractical due to the significant capital cost associated with such automated test systems.

It is evident from the above discussion that a need exists for improved methods and structures to permit high speed TDF testing of integrated circuits without requiring costly upgrade of older legacy automated test systems.

SUMMARY OF THE INVENTION

The present invention solves the above and other problems, thereby advancing the state of the useful arts, by providing methods and associated structure for high speed TDF testing of integrated circuits using older, legacy automated test systems incapable of directly generating requisite high speed launch and capture TDF testing signals. In accordance with features and aspects hereof, a phase lock loop circuit ("PLL") within the integrated circuit under test may receive a slower reference clock supplied by the automated test system and the PLL may be used to generate a higher frequency clock signal (i.e., a PLL Clock signal) within the integrated circuit. A TDF Enable signal may be generated by the automated test system and applied to the integrated circuit under test to enable TDF logic to generate the requisite high speed launch and capture TDF test signals from the higher frequency PLL Clock in accordance with features and aspects hereof.

A first feature of the invention provides an integrated circuit configured for timing delay fault testing, the integrated circuit comprising: a reference clock input signal path configured to receive an externally generated reference clock signal having a first frequency; a phase lock loop coupled to the reference clock input signal path and configured to generate a PLL Clock signal having a second frequency wherein the second frequency is higher than the first frequency of the external reference clock signal; a TDF enable input signal path configured to receive an externally generated TDF enable signal to enable operation of the integrated circuit to perform timing delay fault testing; and control logic coupled to receive the PLL Clock signal and coupled to receive the TDF enable signal and configured to use the PLL Clock signal to generate a timing delay fault launch pulse and to generate a timing delay fault capture pulse.

Another aspect further provides that the control logic further comprises: gate logic coupled to receive the PLL Clock signal and configured to selectively apply the PLL Clock signal to a TDF Clock signal path within the integrated circuit in response to receipt of a Control Signal; and counter logic communicatively coupled to the gate logic to generate the Control Signal for a duration of two clock periods of the PLL Clock signal in response to receipt of the TDF enable signal.

Another aspect further provides that the gate logic further comprises: an AND gate having two input signal paths and an output signal path coupled to the TDF Clock signal path; and a D-flop having a clock input coupled to receive the PLL Clock signal and having a CLR input coupled to receive the Control Signal and having a D input signal path coupled to a logic 1 level and having a Q output signal path, wherein the Q output signal path is coupled to a first input of the AND gate and wherein the second input signal path of the AND gate is coupled to the PLL Clock signal such that the PLL Clock signal is applied to the TDF Clock signal path only for such period of time as the CLR input is held active high by the Control Signal.

Another aspect further provides that the counter logic further comprises: a two bit counter configured to generate the Control Signal for two PLL Clock signal periods in response to receipt of the TDF enable signal.

Another aspect further provides that the two bit counter further comprises: a first D-flop having a CLR input signal path coupled to receive the external TDF enable signal and having a clock input signal path coupled to the TDF Clock signal path and having Qbar output signal path and having a D input signal path coupled to the Qbar output signal path of the first D-flop; a second D-flop having a CLR input signal path couple to receive the external TDF enable signal and having a clock input signal path coupled to the Qbar output signal path of the first D-flop and having a Qbar output signal path and having a D input signal path coupled to the Qbar output signal path of the second D-flop; and an AND gate having a first input coupled to receive the external TDF enable signal and having a second input signal path coupled to the Qbar output signal path of the second D-flop and having an output signal path coupled to the gate logic wherein the Control Signal is generated as the output signal of the AND gate.

Another feature provides a system comprising: an automated test system configured for testing an integrated circuit wherein the automated test system is configured to apply a reference clock signal to the integrated circuit and is configured to apply a TDF enable signal to the integrated circuit to enable timing delay fault testing of the integrated circuit; and an integrated circuit coupled to the automated test system, the integrated circuit comprising: a reference clock input signal path adapted to receive the reference clock signal; a TDF enable signal path adapted to receive the TDF enable signal; a phase lock loop coupled to the reference clock input signal path to generate a PLL Clock signal from the reference clock signal wherein the PLL Clock signal has a higher frequency than the frequency of the reference clock signal; and control logic coupled to the TDF enable signal path and coupled to the phase lock loop and adapted to generate a launch and capture clock pulses from the PLL Clock signal in response to the TDF enable signal.

Another aspect further provides that the control logic further comprises: gate logic coupled to receive the PLL Clock signal and configured to selectively apply the PLL Clock signal to a TDF Clock signal path within the integrated circuit in response to receipt of a Control Signal; and counter logic communicatively coupled to the gate logic to generate the Control Signal for a duration of two clock periods of the PLL Clock signal in response to receipt of the TDF enable signal.

Another aspect further provides that the gate logic further comprises: an AND gate having two input signal paths and an output signal path coupled to the TDF Clock signal path; and a D-flop having a clock input coupled to receive the PLL Clock signal and having a CLR input coupled to receive the Control Signal and having a D input signal path coupled to a logic 1 level and having a Q output signal path, wherein the Q output signal path is coupled to a first input of the AND gate and wherein the second input signal path of the AND gate is coupled to the PLL Clock signal such that the PLL Clock signal is applied to the TDF Clock signal path only for such period of time as the CLR input is held active high by the Control Signal.

Another aspect further provides that the counter logic further comprises: a two bit counter configured to generate the Control Signal for two PLL Clock signal periods in response to receipt of the TDF enable signal.

Another aspect further provides that the two bit counter further comprises: a first D-flop having a CLR input signal path coupled to receive the external TDF enable signal and having a clock input signal path coupled to the TDF Clock signal path and having Qbar output signal path and having a D input signal path coupled to the Qbar output signal path of the first D-flop; a second D-flop having a CLR input signal path couple to receive the external TDF enable signal and having a clock input signal path coupled to the Qbar output signal path of the first D-flop and having a Qbar output signal path and having a D input signal path coupled to the Qbar output signal path of the second D-flop; and an AND gate having a first input coupled to receive the external TDF enable signal and having a second input signal path coupled to the Qbar output signal path of the second D-flop and having an output signal path coupled to the gate logic wherein the Control Signal is generated as the output signal of the AND gate.

Another feature provides a method for performing timing delay fault testing of an integrated circuit, the method comprising: providing an automated test system configured to perform timing delay fault testing of an integrated circuit; coupling an integrated circuit to be tested to the automated test system; applying a reference clock signal generated in the automated test system to a reference clock input signal path of the integrated circuit; applying a TDF enable signal generated in the automated test system to a TDF enable input signal path of the integrated circuit; generating a PLL Clock signal having a higher frequency than the reference clock signal using a PLL circuit coupled to the reference clock input signal path to receive the reference clock signal; and generating launch and capture clock pulses within the integrated circuit from the PLL Clock signal in response to receipt of the TDF enable signal on the TDF enable input signal path to thereby perform a timing delay fault test within the integrated circuit.

Another aspect further provides that the step of generating launch and capture clock pulses further comprises: controllably applying the PLL Clock signal to a TDF Clock signal path to generate pulses on the TDF Clock signal path representing the launch and capture clock pulses; counting pulses on the TDF Clock signal path; and terminating application of the PLL Clock signal to the TDF Clock signal path upon sensing two pulses generated on the TDF Clock signal path.

Another aspect further provides that the step of generating launch and capture clock pulses further comprises: enabling application of the PLL Clock signal to a TDF Clock signal path to generate pulses on the TDF Clock signal path representing the launch and capture clock pulses; and disabling application of the PLL Clock signal to the TDF Clock signal path upon sensing two pulses generated on the TDF Clock signal path.

BRIEF DESCRIPTION OF THE DRAWINGS

FIG. 1 is a block diagram of an exemplary system for TDF testing using a PLL and TDF control logic within the integrated circuit under test to generate high speed TDF test signals in accordance with features and aspects hereof.

FIG. 2 is a block diagram showing additional details of an exemplary embodiment of the TDF control logic of FIG. 1 in accordance with features and aspects hereof.

FIG. 3 is a block diagram showing additional details of an exemplary embodiment of the gating logic of FIG. 2 in accordance with features and aspects hereof.

FIG. 4 is a block diagram showing additional details of an exemplary embodiment of the counting logic of FIG. 2 in accordance with features and aspects hereof.

FIG. 5 is a block diagram showing additional details of another exemplary embodiment of the counting logic of FIG. 2 in accordance with features and aspects hereof.

FIG. 6 is a timing diagram showing exemplary signal timing and relationships for exemplary signals as above in FIGS. 2, 3 and 5 and in accordance with features and aspects hereof.

FIG. 7 is a flowchart describing an exemplary method of operating apparatus and systems as in FIGS. 1–6 in accordance with features and aspects hereof.

DETAILED DESCRIPTION OF THE DRAWINGS

FIG. 1 is a block diagram of a system 100 embodying features and aspects hereof to provide high speed TDF testing of an integrated circuit 104 in conjunction with automated test system 102. Automated test system 102 may be any well known, commercially available automated test system useful for testing integrated circuits such as integrated circuit 104 or may be a customized system configured to test integrated circuit 104. Automated test system 102 generates a reference clock signal 150 applied to a reference clock input signal path 154 of integrated circuit 104. Any of several well-known techniques and structures within automated test system 102 may be utilized for generating reference clock signal 150. When TDF testing of integrated circuit 104 is desired, automated test system 102 generates a TDF Enable signal 152 applied to TDF enabled signal input path 156 of integrated circuit 104. As a matter of design choice, TDF Enable signal 152 may be an active high signal.

Integrated circuit 104 may include application specific logic 110 for performing the desired application specific functional features of integrated circuit 104. PLL circuit 108 may receive reference clock signal 150 on reference clock input signal path 154 and may generate PLL Clock 158 applied to TDF Control Logic 106. PLL Clock 158 is typically a higher frequency clock than the reference clock signal 150 applied as input to PLL circuit 108. For example, reference clock signal 150 may be a clock having a frequency no higher than 200 MHz in accordance with capabilities of certain, present commercially available automated test systems 102. By contrast, PLL Clock 158 generated by PLL circuit 108 may provide a 4× multiplier to the reference clock signal to thereby generate an 800 MHz PLL Clock signal. Those of ordinary skill in the art will readily recognize that, as a matter of design choice, essentially any multiplier may be applied to the reference clock signal 150 by PLL circuit 108 to generate the PLL Clock 158.

Those of ordinary skill in the art will recognize that PLL circuit 108 may be added into integrated circuit 104 specifically for TDF testing capabilities. Alternatively, as a matter of design choice, PLL circuit 108 may represent a portion of application specific logic 110 utilized within integrated circuit 104 for other application specific features. Such a PLL circuit 108 integrated within application specific logic 110 may therefore serve the dual purpose of application specific features and TDF testing features in accordance with aspects hereof.

TDF Control Logic 106 within integrated circuit 104 receives the TDF Enable signal 152 on path 156, and receives PLL Clock 158, and generates a TDF Clock signal 160 applied to application specific logic 110 to perform desired TDF testing. More specifically, TDF logic 106 may receive PLL Clock 158 and generate only the requisite two TDF Clock pulses—namely: the launch clock or pulse and the capture clock or pulse. TDF Control Logic 106 therefore represents any suitable means for generating requisite TDF Clock pulses within integrated circuit 104 derived from PLL Clock 158 also generated within integrated circuit 104.

Those of ordinary skill in the art will readily recognize numerous additional signals exchanged between automated test system 102 and integrated circuit 104 for purposes of performing TDF and other desired testing of integrated circuit 104. The reference clock signal 150 and TDF Enable signal 152 are shown as exemplary signals exchanged for purposes of performing TDF testing of integrated circuit 104 by automated test system 102. Numerous other configurations and signals will be readily apparent to those of ordinary skill in the art for providing a fully functional, typical automated test system.

FIG. 2 is a block diagram providing additional details of an exemplary embodiment of TDF Control Logic 106 in FIG. 1. TDF Control Logic 106 receives PLL Clock 158 and TDF Enable signal 156 and generates required TDF testing pulses as TDF Clock 160. TDF Control Logic 106 may include Gating Logic 200 and Counting Logic 202 for generating the requisite TDF launch and capture pulse signals as TDF Clock 160. In general, Gating Logic 200 applies clock pulses from PLL Clock 158 to TDF Clock 160 to represent the desired TDF testing launch and capture pulse signals. Gating Logic 200 transfers these pulse signals between paths 158 and 160 only when so enabled by Control Signal 204 (also referred to herein as TDF_GO) generated by Counting Logic 202. Counting Logic 202 receives the TDF Enable signal on path 156 and sets the Control Signal 204 in response thereto. The Control Signal 204 disables further application of PLL Clock 158 to TDF Clock 160 when Counting Logic 202 senses that exactly two pulses have been applied to TDF Clock 160. Gating Logic 200 therefore represents any means for applying clock pulses from PLL Clock 158 to TDF Clock 160 under control of Control Signal 204 generated by Counting Logic 202. Counting Logic 202 therefore represents any means for controlling Control Signal 204 in response to enablement by TDF Enable 156 and responsive to the counting of two pulses applied to TDF Clock 160. In particular, counting logic 202 represents any means for counting a sequence of two pulses applied to TDF Clock signal path 160 representing the launch pulse or clock and capture pulse or clock applied in sequence to TDF Clock 160.

FIG. 3 is a schematic diagram of one exemplary embodiment of Gating Logic 200 in accordance with features and aspects hereof. Gating Logic 200 in FIG. 3 includes D-flop 300 and AND gate 302. AND gate 302 receives PLL Clock 158 as one input and receives the Q output of D-flop 300 on path 350 as a second input. AND gate 302 logically ANDs the two input signals to generate TDF Clock 160. D-flop 300 receives the PLL Clock 158 inverted through inverter 304 on its clock input signal path. The TDF_GO (Control Signal) on path 204 is inverted and applied as the CLR (reset) input to D-flop 300 to reset the Q output signal path of the D-flop 300. The D input signal path receives a constant logic 1 signal on path 352.

FIGS. 4 and 5 depict additional details of exemplary embodiments of Counter Logic 202 in accordance with features and aspects hereof to Control Signal 204 in accordance with the TDF Enable 156 and the TDF Clock 160. Referring first to FIG. 4, counter 400 is a down counter circuit receiving its clock signal as TDF Clock 160 and generates a terminal count (e.g., zero count) signal on path 406 applied through inverter 408 as a first input to AND gate 402. Counter 400 loads an initial value of 2 from path 404 when initially enabled by the TDF Enable 156. When so enabled, counter 400 decrements the remaining count value on each clock pulse received from TDF Clock 160 and signifies a terminal count (i.e., zero count) on path 406 after receiving two clock pulses on TDF Clock 160. TDF Enable 156 is also applied as the second input to AND gate 402. AND gate 402 than logically ANDs the two input signals (the TDF Enable 156 and the terminal count on path 406 (through inverter 408)) to generate the TDF_GO signal (Control Signal) 204.

FIG. 5 shows another exemplary embodiment of Counter Logic 202 in accordance with features and aspects hereof. Counter Logic 202 of FIG. 5 receives TDF Clock 160 and TDF Enable 156 and generates the TDF_GO signal (Control Signal) 204. TDF Enables is applied as a first input to AND gate 510 and also applied as the inverted input signal to the CLR input of D-flop 500 and D-flop 502. D-flop 500 receives TDF Clock 160 through inverter 504 on its clock input. The Qbar output of D-flop 500 is applied as signal 506 to the D input of D-flop 500 and as the clock input to D-flop 502. D-flop 502 generates its Qbar output and applies it to path 508 its D input. The Qbar output on path 508 is also applied as the second input signal to AND gate 510. AND gate 510 logically ANDs its two input signals to generate the TDF_GO signal(Control Signal) on signal path 204.

Those of ordinary skill in the art will readily recognize that the circuits of FIGS. 3 through 5 are merely representative of one exemplary embodiment of circuits useful in implementing TDF Control Logic 106 of FIGS. 1 and 2. Numerous equivalent structures will be readily apparent to those of ordinary skill in the art for receiving a PLL Clock generated within the integrated circuit under test and for generating TDF Clock pulses for performing TDF testing at high frequency within the integrated circuit. More specifically, those of ordinary skill in the art will readily recognize structures for generating the launch and capture sequence of high speed pulses within the integrated circuit under test by utilizing a PLL Clock generated within the integrated circuit at a higher frequency than a an external automated test system may be capable of generating.

FIG. 6 is an exemplary timing diagram showing the approximate relative timing of exemplary signals associated with the circuits of FIGS. 2, 3 and 5. Reference Clock (154 of FIG. 2) is supplied by the automated test system external to the integrated circuit under test. Reference clock may be, for example, a 100 Mhz tester supplied clock signal. PLL Clock (158 of FIGS. 2, 3 and 5) may therefore multiply the Reference Clock signal by, for example, 4 to generate a 400 Mhz PLL Clock signal for TDF testing (and optionally for other application specific purposes in the integrated circuit). TDF Enable (156 of FIGS. 2, 3 and 5) is generated by the testing system to signify its desire to commence TDF testing within the integrated circuit under test. When the TDF Enable signal goes active high, the TDF_GO (Control Signal 204 of FIGS. 2, 3 and 5) also goes high to remove the reset condition on the D-flop 300 of FIG. 3. The next falling edge of the PLL Clock then causes the Gate signal (Q output of D-flop 300 on path 350 of FIG. 3) to go high enabling the AND gate 302 of FIG. 3 to apply the PLL Clock signal to the TDF Clock signal (160 of FIGS. 2, 3 and 5). The TDF Clock signal controls the 2-bit counter logic (e.g., two flops of FIG. 5) to count two clock pulses of the TDF Clock signal. The first falling edge of the TDF Clock increments the count logic (i.e., Qbar of the D-flop 500–signal 506 of FIG. 5) and the second falling edge again increments the counter (i.e., Qbar of the D-flop 502–signal 508 of FIG. 5). This second count forces the TDF_GO (Control Signal 204) low which, in turn, forces the Gate signal low thus disabling the AND gate of FIG. 3 from applying the PLL Clock to the TDF Clock. TDF Enable eventually goes low—dropped by the automated test system to reset the entire circuit until a next TDF test is desired.

Those of ordinary skill in the art will readily recognize that the timing diagrams of FIG. 6 are intended merely as representative of one possible timing relationship for generating desired TDF Clock pulses from a PLL Clock all within the integrated circuit under test. Further, those of ordinary skill in the art will recognize that the timing diagram of FIG. 6 is not intended as representative of precise timing of signals but rather is intended merely to suggest the approximate relationship of useful signals for generating desired TDF test pulses within an integrated circuit having a PLL Clock generator.

FIG. 7 is a flowchart describing a method of testing an integrated circuit by generating TDF test clock pulses within an integrated circuit under test. The flowchart of FIG. 7 describes a process that is performed, in part, within the automated test system and, in part, within the integrated circuit under test. Elements on the left side of the vertical dashed line in FIG. 7 may be performed within an automated test system while elements on the right side of the dashed line may be performed within the integrated circuit under test.

Element 700 is first operable to apply a reference clock signal to a reference clock input signal path of the integrated circuit. The automated test system may generate such a reference clock signal by any of several well-known structures or techniques. Element 702, operable within the integrated circuit under test, receives the applied reference clock signal and applies it as an input to PLL circuit within the integrated circuit to generate a higher frequency PLL Clock within the integrated circuit. Such PLL circuits are well known to those of ordinary skill in the art. Element 704 is then operable within the automated test system to generate a TDF Enable signal and apply the TDF Enable signal to TDF Enable input signal path of the integrated circuit under test. Element 706, operable within the integrated circuit under test, receives the TDF Enable signal and generates a TDF launch and capture sequence of pulses using the PLL Clock generated by element 702. Lastly, element 708, operable within the automated test system, verifies the results of the timing delay fault test to detect passage or failure of the integrated circuit under test and to process the circuit accordingly.

Those of ordinary skill in the art will note that the PLL Clock signal and the TDF pulse signals are both generated internally within the integrated circuit under test rather than relying on the potentially slower clock pulses generated by older legacy automated test systems. Thus, the method of FIG. 7 is capable of performing higher speed TDF testing as required by present-day integrated circuit designs. Further, those of ordinary skill in the art will recognize a variety of equivalent method steps and elements for performing such TDF testing using PLL Clock signals and TDF pulse signals generated within the integrated circuit under test. The process of FIG. 7 is therefore intended merely as representative of one exemplary embodiment of such a method.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. An integrated circuit configured for timing delay fault testing, the integrated circuit comprising:

a reference clock input signal path configured to receive an externally generated reference clock signal having a first frequency;

a phase lock loop coupled to the reference clock input signal path and configured to generate a PLL Clock signal having a second frequency wherein the second frequency is higher than the first frequency of the external reference clock signal;

a TDF enable input signal path configured to receive an externally generated TDF enable signal to enable operation of the integrated circuit to perform timing delay fault testing; and control logic coupled to receive the PLL Clock signal and coupled to receive the TDF enable signal and configured to use the PLL Clock signal to generate a timing delay fault launch pulse and to generate a timing delay fault capture pulse, wherein the control logic further comprises:

gate logic coupled to receive the PLL Clock signal and configured to selectively apply the PLL Clock signal to a TDF Clock signal path within the integrated circuit in response to receipt of a Control Signal; and counter logic communicatively coupled to the gate logic to generate the Control Signal for a duration of two clock periods of the PLL Clock signal in response to receipt of the TDF enable signal, and wherein the gate logic further comprises:

an AND gate having two input signal paths and an output signal path coupled to the TDF Clock signal path; and a D-flop having a clock input coupled to receive the PLL Clock signal and having a CLR input coupled to receive the Control Signal and having a D input signal path coupled to a logic 1 level and having a Q output signal path, wherein the Q output signal path is coupled to a first input of the AND gate and wherein the second input signal path of the AND gate is coupled to the PLL Clock signal such that the PLL Clock signal is applied to the TDF Clock signal path only for such period of time as the CLR input is held active high by the Control Signal.

2. An integrated circuit configured for timing delay fault testing, the integrated circuit comprising:

a reference clock input signal path configured to receive an externally generated reference clock signal having a first frequency;

a phase lock loop coupled to the reference clock input signal path and configured to generate a PLL Clock signal having a second frequency wherein the second frequency is higher than the first frequency of the external reference clock signal;

a TDF enable input signal path configured to receive an externally generated TDF enable signal to enable operation of the integrated circuit to perform timing delay fault testing; and control logic coupled to receive the PLL Clock signal and coupled to receive the TDF enable signal and configured to use the PLL Clock signal to generate a timing delay fault launch pulse and to generate a timing delay fault capture pulse, wherein the control logic further comprises:

gate logic coupled to receive the PLL Clock signal and configured to selectively apply the PLL Clock signal to a TDF Clock signal path within the integrated circuit in response to receipt of a Control Signal; and counter logic communicatively coupled to the gate logic to generate the Control Signal for a duration of two clock periods of the PLL Clock signal in response to receipt of the TDF enable signals, wherein the counter logic further comprises:

a two bit counter configured to generate the Control Signal for two PLL Clock signal periods in response to receipt of the TDF enable signal, and wherein the two bit counter further comprises:

a first D-flop having a CLR input signal path coupled to receive the external TDF enable signal and having a clock input signal path coupled to the TDF Clock signal path and having Qbar output signal path and having a D input signal path coupled to the Qbar output signal path of the first D-flop;

a second D-flop having a CLR input signal path couple to receive the external TDF enable signal and having a clock input signal path coupled to the Qbar output signal path of the first D-flop and having a Qbar output signal path and having a D input signal path coupled to the Qbar output signal path of the second D-flop; and an AND gate having a first input coupled to receive the external TDF enable signal and having a second input signal path coupled to the Qbar output signal path of the second D-flop and having an output signal path coupled to the gate logic wherein the Control Signal is generated as the output signal of the AND gate.

3. A system comprising:

an automated test system configured for testing an integrated circuit wherein the automated test system is configured to apply a reference clock signal to the integrated circuit and is configured to apply a TDF enable signal to the integrated circuit to enable timing delay fault testing of the integrated circuit; and an integrated circuit coupled to the automated test system, the integrated circuit comprising:

a reference clock input signal path adapted to receive the reference clock signal;

a TDF enable signal path adapted to receive the TDF enable signal;

a phase lock loop coupled to the reference clock input signal path to generate a PLL Clock signal from the reference clock signal wherein the PLL Clock signal has a higher frequency than the frequency of the reference clock signal; and control logic coupled to the TDF enable signal path and coupled to the phase lock loop and adapted to generate a launch and capture clock pulses from the PLL Clock signal in response to the TDF enable signal, wherein the control logic further comprises:

gate logic coupled to receive the PLL Clock signal and configured to selectively apply the PLL Clock signal to a TDF Clock signal path within the integrated circuit in response to receipt of a Control Signal; and counter logic communicatively coupled to the gate logic to generate the Control Signal for a duration of two clock periods of the PLL Clock signal in response to receipt of the TDF enable signal, and wherein the gate logic further comprises:

an AND gate having two input signal paths and an output signal path coupled to the TDF Clock signal path; and a D-flop having a clock input coupled to receive the PLL Clock signal and having a CLR input coupled to receive the Control Signal and having a D input signal path coupled to a logic 1 level and having a Q output signal path, wherein the Q output signal path is coupled to a first input of the AND gate and wherein the second input signal path of the AND gate is coupled to the PLL Clock signal such that the PLL Clock signal is applied to the TDF Clock signal path only for such period of time as the CLR input is held active high by the Control Signal.

4. A system comprising:

an automated test system configured for testing an integrated circuit wherein the automated test system is configured to apply a reference clock signal to the integrated circuit and is configured to apply a TDF enable signal to the integrated circuit to enable timing delay fault testing of the integrated circuit; and an integrated circuit coupled to the automated test system, the integrated circuit comprising:

a reference clock input signal path adapted to receive the reference clock signal;

a TDF enable signal path adapted to receive the TDF enable signal;

a phase lock loop coupled to the reference clock input signal path to generate a PLL Clock signal from the reference clock signal wherein the PLL Clock signal has a higher frequency than the frequency of the reference clock signal; and control logic coupled to the TDF enable signal path and coupled to the phase lock loop and adapted to generate a launch and capture clock pulses from the PLL Clock signal in response to the TDF enable signal, wherein the control logic further comprises:

gate logic coupled to receive the PLL Clock signal and configured to selectively apply the PLL Clock signal to a TDF Clock signal path within the integrated circuit in response to receipt of a Control Signal; and counter logic communicatively coupled to the gate logic to generate the Control Signal for a duration of two clock periods of the PLL Clock signal in response to receipt of the TDF enable signal, wherein the counter logic further comprises:

a two bit counter configured to generate the Control Signal for two PLL Clock signal periods in response to receipt of the TDF enable signal, and wherein the two bit counter further comprises:

a first D-flop having a CLR input signal path coupled to receive the external TDF enable signal and having a clock input signal path coupled to the TDF Clock signal path and having Qbar output signal path and having a D input signal path coupled to the Qbar output signal path of the first D-flop;

a second D-flop having a CLR input signal path couple to receive the external TDF enable signal and having a clock input signal path coupled to the Qbar output signal path of the first D-flop and having a Qbar output signal path and having a D input signal path coupled to the Qbar output signal path of the second D-flop; and an AND gate having a first input coupled to receive the external TDF enable signal and having a second input signal path coupled to the Qbar output signal path of the second D-flop and having an output signal path coupled to the gate logic wherein the Control Signal is generated as the output signal of the AND gate.

* * * * *